United States Patent
Sung et al.

(10) Patent No.: US 6,950,082 B2
(45) Date of Patent: Sep. 27, 2005

(54) DISPLAY DRIVING CIRCUIT

(75) Inventors: Chih-Feng Sung, Miaoli (TW); Hsin-Hung Lee, Taipei (TW)

(73) Assignee: AU Optronics Corp., Hsinchu (TW)

( * ) Notice: Subject to any disclaimer, the term of this patent is extended or adjusted under 35 U.S.C. 154(b) by 281 days.

(21) Appl. No.: 10/251,359

(22) Filed: Sep. 20, 2002

(65) Prior Publication Data
US 2003/0146912 A1 Aug. 7, 2003

(30) Foreign Application Priority Data
Feb. 4, 2002 (TW) .................................. 91101921 A

(51) Int. Cl.[7] .............................................. G09G 3/32
(52) U.S. Cl. ........................... 345/82; 345/42; 345/48; 345/92; 318/169.1
(58) Field of Search ................... 345/82, 92, 42–48; 315/169.1, 169.3

(56) References Cited

U.S. PATENT DOCUMENTS 6,229,506 B1 * 5/2001 Dawson et al. ............... 345/82
6,229,508 B1 * 5/2001 Kane ............................ 345/82
6,693,388 B2 * 2/2004 Oomura ................... 315/169.3
6,734,636 B2 * 5/2004 Sanford et al. .......... 315/169.3
2003/0098829 A1 * 5/2003 Chen et al. .................... 345/82

* cited by examiner

Primary Examiner—Kent Chang
(74) Attorney, Agent, or Firm—Ladas & Parry LLP

(57) ABSTRACT

A display driving circuit. The circuit comprises a first electrode from which a data signal is output, a second electrode from which a scan signal is output, a capacitor having a first and second end with a voltage difference therebetween, a light emitting diode having an anode and cathode coupled to a first power supply providing a first voltage(Vss), a first switch having a first end coupled to the first electrode to receive the data signal and a second end coupled to the first end of the capacitor, a second switch having a first end coupled to a second power supply providing a second voltage(VDD) and a second end coupled to the anode of the light emitting diode, and a third switch having a first end coupled to a third power supply providing a third voltage(Vref) and a second end coupled to the second end of the capacitor.

13 Claims, 2 Drawing Sheets

DISPLAY DRIVING CIRCUIT

BACKGROUND OF THE INVENTION

1. Field of the Invention

The present invention relates to a circuit for a display, particularly to a driving circuit for an active matrix display, which includes amorphous-Si TFTs.

2. Description of the Prior Art

FIG. 1 is a diagram showing a conventional display driving circuit. The driving circuit 1 comprises a data electrode 11, a scan electrode 12 and a display cell composed of transistors 131, 132, capacitor 134 and light emitting diode 133. For clarity, there are only four display cells shown in FIG. 1. A data signal and scan signal are output from the data electrode 11 and scan electrode 12 respectively. In each of the display cells, the transistor 131 is turned on by the scan signal received by the gate, whereby the data signal is transferred to the gate of the transistor 132 through the transistor 131. There is a voltage difference generated by the data signal and stored on the capacitor 134. This voltage difference determines whether the transistor 132 is turned on. A current flows through and turns on the light emitting diode 133 when the transistor 132 is turned on; otherwise the light emitting diode 133 is turned off. Thus, by the scan signal sequentially scanning rows of the display cells, image data carried on the data signal is sent to each cell. Frames of image are formed by pixels with different luminance or colors which are determined by the light emitting diodes of the cells.

In the conventional display driving circuit described here, the transistor 131 may be an amorphous-Si TFT with low current driving ability since it is only used as a switch. On the contrary, the transistor 132 must be a poly-Si TFT with high current driving ability since it is used to drive the current flowing through the light emitting diode addition to being used as a switch. This results in a complicated manufacturing process, and increases the cost and decreases the yield of the display driving circuit manufacture.

However, it is impossible for all the transistors in the conventional display driving circuit to be amorphous-Si TFTs for the following reasons. First, the current driving ability of the amorphous-Si TFT is too low to provide a current high enough to turn on the light emitting diode. Second, the configuration in which the light emitting diode is disposed on the drain side of the transistor is disadvantageous to the manufacturing process of a driving circuit composed of the amorphous-Si TFTs.

SUMMARY OF THE INVENTION

Therefore, the object of the present invention is to provide a display driving circuit with transistors only including amorphous-Si TFTs. This reduces the complexity of manufacturing.

The present invention provides a display driving circuit. The circuit comprises a first electrode from which a data signal is output, a second electrode from which a scan signal is output, a capacitor having a first and second end with a voltage difference therebetween, a light emitting diode having an anode and cathode coupled to a first power supply providing a first voltage(Vss), a first switch having a first end coupled to the first electrode to receive the data signal and a second end coupled to the first end of the capacitor, a second switch having a first end coupled to a second power supply providing a second voltage(VDD) and a second end coupled to the anode of the light emitting diode, and a third switch having a first end coupled to a third power supply providing a third voltage(Vref) and a second end coupled to the second end of the capacitor.

The present invention further provides a display driving circuit. The driving circuit comprises a first electrode from which a data signal is output, a second electrode from which a scan signal is output, a light emitting diode having an anode and cathode coupled to a first power supply providing a first voltage(Vss), a first transistor having a drain, a source coupled to the first end of the capacitor and a gate coupled to the second electrode to receive the scan signal, a second transistor having a drain coupled to a second power supply providing a second voltage(VDD), a source coupled to the anode of the light emitting diode, and a gate coupled to the source of the first transistor, a capacitor having a first and second end with a voltage difference therebetween, wherein the first end is coupled to the gate of the second transistor and the second end is coupled to the source of the second transistor, a third switch having a drain coupled to a third power supply providing a third voltage(Vref) and a source coupled to the source of the second transistor, and a gate coupled to the gate of the first transistor.

Thus, the current flowing through the light emitting diode is provided by parallelly connected amorphous-Si TFTs and the light emitting diode is disposed on the source side of the transistor, which is advantageous to the manufacturing process of a driving circuit composed of the amorphous-Si TFTs. Additionally, there is a capacitor connected between the source and gate of the transistor proving the driving current of the light emitting diode for stabilizing the gate-to-source voltage, and a switch between its source and a reference voltage power supply to avoid a situation in which the transistor is always turned on despite the voltage level of the data signal.

BRIEF DESCRIPTION OF THE DRAWINGS

The following detailed description, given by way of example and not intended to limit the invention solely to the embodiments described herein, will best be understood in conjunction with the accompanying drawings, in which.

DETAILED DESCRIPTION OF THE INVENTION

Figure 1:
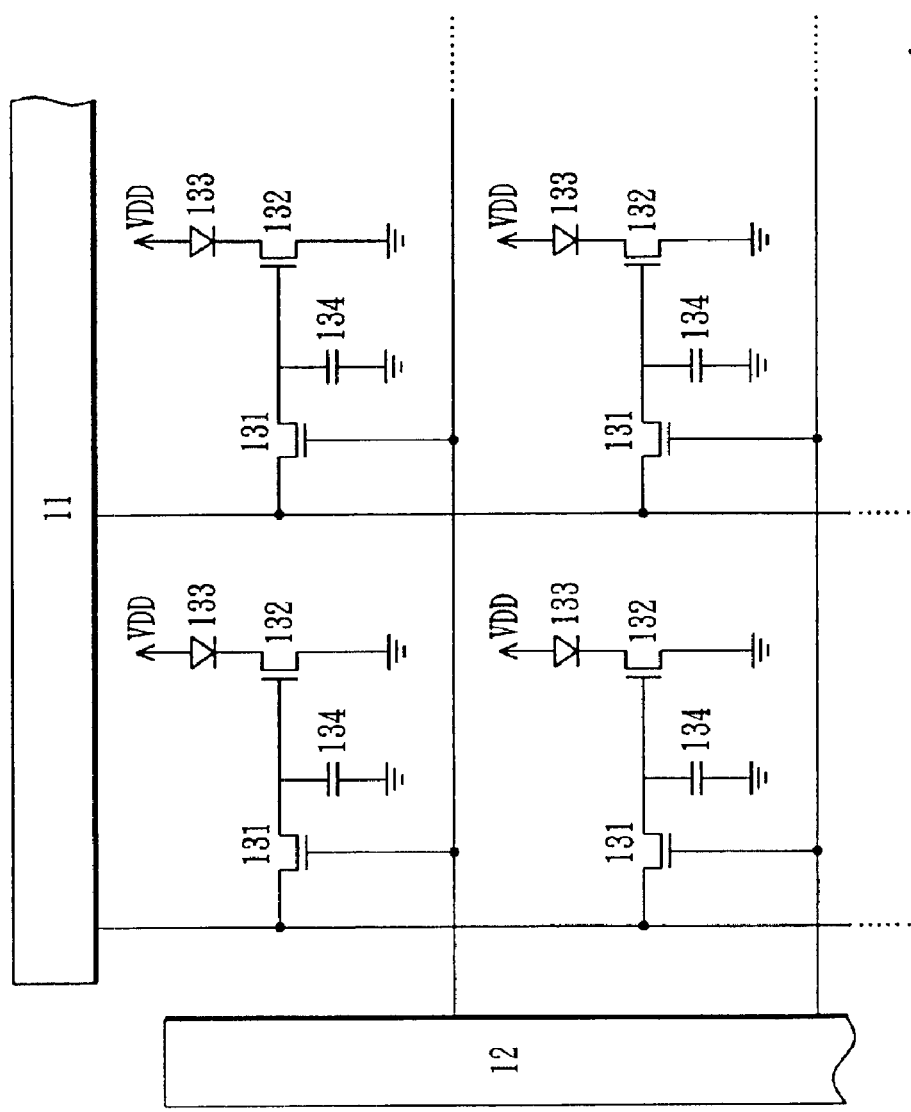
FIG. 1 is a diagram showing a conventional display driving circuit.
Figure 2:
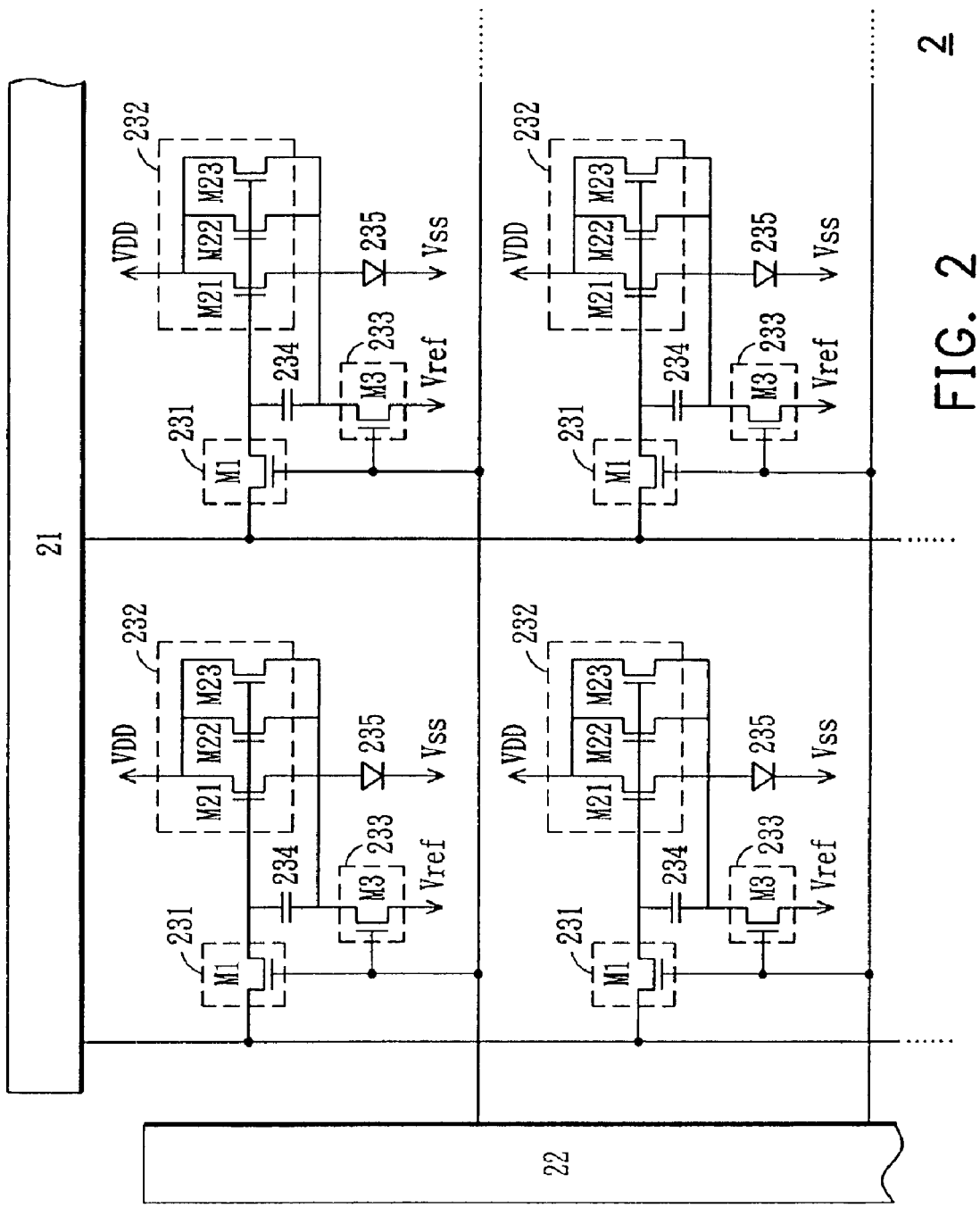
FIG. 2 is a diagram showing a display driving circuit according to one embodiment of the invention.

FIG. 2 is a diagram showing a display driving circuit according to one embodiment of the invention. The driving circuit 2 comprises a data electrode 21, a scan electrode 22 and a display cell composed of switches 231, 232, 233, capacitor 234 and light emitting diode 235. The light emitting diode 235 may be an OLED or PLED. For clarity, there are only four display cells shown in FIG. 2. A data signal and scan signal are output from the data electrode 21 and scan electrode 22 respectively. In each of the display cells, the cathode of the light emitting diode 235 is coupled to a power supply (not shown) providing a first voltage Vss. The voltage Vss is a negative voltage. Thus, the cathode of the light emitting diode 235 receives a negative voltage Vss. A first end of the first switch 231 is coupled to the data electrode 21 to receive the data signal. A second end of the first switch 231 is coupled to a third end of the second switch 232 and to a first end of capacitor 234. A first end of the second switch 232 is coupled to a power supply (not shown)

providing a second voltage VDD. The second voltage VDD is positive. A second end of the second switch 232 is coupled to the anode of the light emitting diode 235. A first end of the third switch 233 is coupled to a power supply (not shown) providing a third voltage Vref. A second end of the switch 233 is coupled to a second end of the capacitor 234. Thus, the capacitor 234 is connected between the switch 231 and 233. Both switches 231 and 233 are controlled by the scan signal output from the scan electrode 22. The switch 232 is controlled by a voltage difference on the capacitor 234.

The first and third switch 231 and 233 are a first and third amorphous-Si TFT M1 and M3 respectively while the second switch 232 comprises several parallelly connected amorphous-Si TFTs. In this embodiment, the second switch 232 comprises a second, fourth and fifth amorphous-Si TFT M21, M22 and M23 parallelly connected. The drains of the transistors M21, M22 and M23 are coupled to the power supply providing the positive voltage VDD. The sources thereof are coupled to the anode of the light emitting diode 235. Their gates are coupled to the source of the first transistor M1.

The drain of the first transistor M1 is coupled to the data electrode 21 to receive the data signal. Its source is coupled to the gates of the transistor M21, M22 and M23. Its gate is coupled to the scan electrode 22 to receive the scan signal. The source of the third transistor M3 is coupled to the anode of the light emitting diode 235. Its drain is coupled to the power supply providing the third voltage Vref. Its gate is coupled to the scan electrode to receive the scan signal. The capacitor 234 is connected between the gates and sources of the transistor M21, M22 and M23.

The operation of the display driving circuit will be explained in the following.

In each display cell, the data signal output from the data electrode 21 is transferred to the first end of the capacitor 234 through the closed switch 231 (the transistor M1 being turned on) when the first and third switch 231 and 232 are closed (the transistor M1 and M3 being turned on) by the scan signal having a high logic level output from the scan electrode 22. The second end of the capacitor 234 is coupled to the power supply providing the third voltage Vref through the closed switch 233 (the transistor M3 being turned on). Thus, the voltage difference Vgs on the capacitor 234 is determined by a difference of the voltage level of the data signal and the third voltage Vref.

If the data signal has a low logic level, it is transferred to the gates of the transistor M21, M22 and M23. The third voltage Vref is transferred to the sources of the transistor M21, M22 and M23. The second switch 232 is opened (the transistor M21, M22 and M23 are turned off) by the voltage difference on the capacitor 234. Thus, the light emitting diode 235 is turned off.

If the data signal has a high logic level, the second switch 232 is closed (the transistor M21, M22 and M23 are turned on). The current flowing through the light emitting diode 235 is provided by the transistors M3, M21, M22 and M23. Since the combined current driving ability of the parallelly connected transistors M21, M22 and M23 is high enough to drive the current turning on the light emitting diode 235, the light emitting diode 235 is turned on.

Therefore, by the scan signal sequentially scanning rows of the display cells, image data carried on the data signal is sent to each cell. Frames of image are formed by pixels with different luminance or colors which are determined by the light emitting diodes of the cells.

In this embodiment, the light emitting diode 235 is disposed on the source side of the transistor instead of the drain side. The transistors M21, M22 and M23 provide the current flowing through the light emitting diode 235. The magnitude of the current flowing through the light emitting diode 235 depends on the gate-to-source voltage of the transistors M21, M22 and M23. The capacitor 234 connected between the gates and sources of the transistors M21, M22 and M23 is to provide a stable gate-to-source voltage so that the current flowing through the light emitting diode 235 is also stable. The switch 233 controlled by the scan signal is connected between the sources of the transistor M21, M22 and M23 to avoid a situation in which the transistors M21, M22 and M23 are always turned on despite the voltage level of the data signal, which results from the negative voltage Vss received by the cathode of the light emitting diode 235.

In conclusion, in the present invention, the current flowing through the light emitting diode is provided by parallelly connected amorphous-Si TFTs and the light emitting diode is disposed on the source side of the transistor, which is advantageous to the manufacturing process of a driving circuit composed of the amorphous-Si TFTs. Additionally, there is a capacitor connected between the source and gate of the transistor proving the driving current of the light emitting diode to stabilize the gate-to-source voltage, and a switch between its source and a reference voltage power supply to avoid a situation in which the transistor is always turned on despite the voltage level of the data signal.

While the invention has been described by way of example and in terms of the preferred embodiment, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A display driving circuit comprising:
   a first electrode from which a data signal is output;
   a second electrode from which a scan signal is output;
   a capacitor having a first and second end with a voltage difference therebetween;
   a light emitting diode having an anode and cathode coupled to a first power supply providing a first voltage (Vss);
   a first switch having a first end coupled to the first electrode to receive the data signal and a second end coupled to the first end of the capacitor;
   a second switch having a first end coupled to a second power supply providing a second voltage(VDD) and a second end coupled to the anode of the light emitting diode and the second end of the capacitor; and
   a third switch having a first end coupled to a third power supply providing a third voltage(Vref) and a second end coupled to the second end of the capacitor; wherein
   each of the first, second and third switches further has a third end, the third ends of the first and third switch are coupled to the second electrode to receive the scan signal controlling the first and third switch, and the third end of the second switch is coupled to the first end of the capacitor.

2. The display driving circuit as claimed in claim 1, wherein second switch is controlled by the voltage difference between the first and second end of the capacitor.

3. The display driving circuit as claimed in claim 2, wherein the data signal is transferred to the capacitor through the first switch to generate the voltage difference between the first and second end of the capacitor when the first and third switches are closed by the scan signal.

4. The display driving circuit as claimed in claim 1, wherein the first, second and third switches comprise a first, second and third transistor respectively, each of the first, second and third switches has a drain, source and gate, the drains of the first, second and third switches being the first ends of the first, second and third switches, the sources of the first, second and third switches being the second ends of the first, second and third switches, and the gates of the first, second and third switches being the third ends of the first, second and third switches, respectively.

5. The display driving circuit as claimed in claim 4, wherein the second switch further comprises a fourth transistor parallel with the second transistor, the fourth transistor has a drain, source and gate, the gates of the second and fourth transistor are coupled to the first end of the capacitor, and the sources of the second and fourth transistor are coupled to the second end of the capacitor.

6. The display driving circuit as claimed in claim 4, wherein the transistors are amorphous-Si TFTs.

7. The display driving circuit as claimed in claim 1, wherein the light emitting diode is an OLED.

8. The display driving circuit as claimed in claim 1, wherein the light emitting diode is a PLED.

9. A display driving circuit comprising:

a first electrode from which a data signal is output;

a second electrode from which a scan signal is output;

a light emitting diode having an anode and cathode coupled to a first power supply providing a first voltage (Vss);

a first transistor having a drain coupled to the first electrode to receive the data signal, a source, and a gate coupled to the second electrode to receive the scan signal;

a second transistor having a drain coupled to a second power supply providing a second voltage(VDD), a source coupled to the anode of the light emitting diode, and a gate coupled to the source of the first transistor;

a capacitor having a first and second end with a voltage difference therebetween, wherein the first end is coupled to the gate of the second transistor and the source of the first transistor, and the second end is coupled to the source of the second transistor; and a third transistor having a drain coupled to a third power supply providing a third voltage(Vref) and a source coupled to the source of the second transistor and the second end of the capacitor, and a gate coupled to the gate of the first transistor.

10. The display driving circuit as claimed in claim 9 further comprising a fourth transistor parallel with the second transistor, having a drain receiving the second voltage, a source coupled to the anode of the light emitting diode and a gate coupled to the source of the first transistor.

11. The display driving circuit as claimed in claim 9, wherein the transistors are amorphous-Si TFTs.

12. The display driving circuit as claimed in claim 9, wherein the light emitting diode is an OLED.

13. The display driving circuit as claimed in claim 9, wherein the light emitting diode is a PLED.

* * * * *